United States Patent
Hirose et al.

(10) Patent No.: US 9,678,428 B2
(45) Date of Patent: Jun. 13, 2017

(54) LIGHT IRRADIATING APPATARUS

(71) Applicant: USHIO DENKI KABUSHIKI KAISHA, Tokyo (JP)

(72) Inventors: Kenichi Hirose, Hyogo (JP); Tetsuya Murakami, Hyogo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/867,906

(22) Filed: Sep. 28, 2015

(65) Prior Publication Data
US 2016/0018736 A1    Jan. 21, 2016

Related U.S. Application Data

(63) Continuation of application No. PCT/JP2014/056415, filed on Mar. 12, 2014.

(30) Foreign Application Priority Data

Mar. 28, 2013 (JP) .................................. 2013-068518
Dec. 25, 2013 (JP) .................................. 2013-266563

(51) Int. Cl.
G03F 7/20 (2006.01)
G03F 7/42 (2006.01)

(52) U.S. Cl.
CPC . *G03F 7/20* (2013.01); *G03F 7/42* (2013.01)

(58) Field of Classification Search
CPC ....................................................... G03F 7/20
USPC ..... 250/492.1, 492.2, 492.21, 492.22, 493.1, 250/504 R
See application file for complete search history.

(56) References Cited

U.S. PATENT DOCUMENTS

| | | | |
|---|---|---|---|
| 2003/0015669 A1* | 1/2003 | Janos | G03F 7/70025 250/492.2 |
| 2007/0263207 A1* | 11/2007 | Mertz | G01N 21/0332 356/300 |
| 2012/0228261 A1* | 9/2012 | Watanabe | G03F 7/40 216/41 |

FOREIGN PATENT DOCUMENTS

| | | |
|---|---|---|
| JP | H10-199854 A | 7/1998 |
| JP | H11-231554 A | 8/1999 |
| JP | 2948110 B2 | 9/1999 |
| JP | 2003-047842 A | 2/2003 |

(Continued)

OTHER PUBLICATIONS

International Search Report issued in Application No. PCT/JP2014/056415, mailed May 13, 2014.

*Primary Examiner* — Nicole Ippolito
(74) *Attorney, Agent, or Firm* — Michael Best & Friedrich LLP

(57) ABSTRACT

A light irradiating apparatus that may include: an ultraviolet light emission lamp configured to emit vacuum ultraviolet light toward a workpiece to be disposed in an atmosphere of a treatment gas including oxygen; a light passing window adapted to be disposed between the workpiece and the ultraviolet light emission lamp and configured to allow the vacuum ultraviolet light from the ultraviolet light emission lamp to pass therethrough, in which the light passing window has a light-exiting surface; and a spacer adapted to be disposed between the light passing window and the workpiece, to apply a pressing force onto the workpiece and to form a gap that allows a distance from the light-exiting surface of the light passing window to a surface of the workpiece to be of a uniform size over the entire surface of the workpiece.

13 Claims, 6 Drawing Sheets

(56) References Cited

FOREIGN PATENT DOCUMENTS

| JP | 2003-051480 A | 2/2003 |
|---|---|---|
| JP | 3624116 B2 | 3/2005 |
| JP | 2006-339485 A | 12/2006 |
| JP | 2011-181535 A | 9/2011 |
| JP | 2011-192764 A | 9/2011 |

* cited by examiner

Related Art

LIGHT IRRADIATING APPATARUS

CROSS REFERENCE TO RELATED APPLICATIONS

This is a continuation of International Application No. PCT/JP2014/056415, filed Mar. 12, 2014, which claims the benefit of Japanese Priority Patent Application Nos. JP2013-068518, filed Mar. 28, 2013, and JP2013-266563, filed Dec. 25, 2013, the entire contents of all of which are incorporated herein by reference.

BACKGROUND

The invention relates to a light irradiating apparatus configured to irradiate a workpiece with vacuum ultraviolet light.

Currently, dry cleaning method using ultraviolet light is known as a method of performing, for example, light ashing treatment of a resist in manufacturing processes of semiconductors, liquid crystal, etc., dry cleaning treatment for removal of a resist attached to a patterned surface of a template in a nanoimprint device or of glass substrates for liquid crystal or silicon wafers, and smear removal (desmear) treatment in manufacturing processes of printed circuit boards. In particular, a method with use of active oxygen such as ozone produced by vacuum ultraviolet light emitted from an excimer lamp is suitable for utilization, enabling predetermined treatment to be performed more effectively in a short time. For such light irradiating apparatuses, various configurations have been proposed so far (for example, refer to Japanese Patent No. 2948110, Japanese Unexamined Patent Application Publication No. H11-231554, and Japanese Unexamined Patent Application Publication No. 2011-181535).

SUMMARY

According to an embodiment of the invention, there is provided a light irradiating apparatus including: an ultraviolet light emission lamp configured to emit vacuum ultraviolet light toward a workpiece to be disposed in an atmosphere of a treatment gas including oxygen; a light passing window adapted to be disposed between the workpiece and the ultraviolet light emission lamp and configured to allow the vacuum ultraviolet light from the ultraviolet light emission lamp to pass therethrough, in which the light passing window has a light-exiting surface; and a spacer adapted to be disposed between the light passing window and the workpiece, to apply a pressing force onto the workpiece and to form a gap that allows a distance from the light-exiting surface of the light passing window to a surface of the workpiece to be of a uniform size over the entire surface of the workpiece.

According to the light irradiating apparatus of the embodiment of the invention, the light passing window allows the spacer to apply the pressing force onto the workpiece. This allows for correction of deformation such as a curvature of the workpiece itself, making it possible to perform treatment with the gap that allows the distance from the light passing window to the workpiece to be of a substantially uniform size. Hence, it is possible to substantially uniformize intensity of the vacuum ultraviolet light to be applied to the surface (a treated surface) of the workpiece, and to substantially uniformize a concentration of ozone to be produced by the vacuum ultraviolet light. This results in uniform treatment of the workpiece.

It is to be understood that both the foregoing general description and the following detailed description are exemplary, and are intended to provide further explanation of the invention as claimed. Also, effects of the invention are not limited to those described above. Effects achieved by the invention may be those that are different from the above-described effects, or may include other effects in addition to those described above.

DETAILED DESCRIPTION

Prior to description of example embodiments of the invention, description is given first of a comparative example of a related art.

Figure 8:
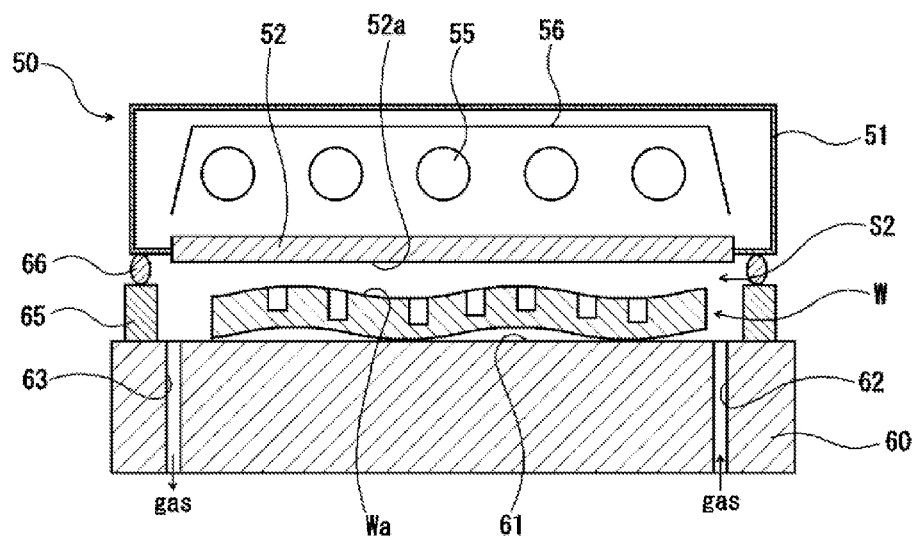
FIG. 8 is a schematic explanatory cross-sectional view of a configuration of one example of a light irradiating apparatus according to a comparative example of a related art.

FIG. 8 illustrates a configuration of some kinds of light irradiating apparatuses utilizing vacuum ultraviolet light. For example, an ultraviolet light emission lamp 55 is configured to emit vacuum ultraviolet light. A workpiece W may be disposed in, for example, an oxygen atmosphere. Light from the ultraviolet light emission lamp 55 may be applied, through a light passing window, to the workpiece W, allowing surface treatment of the workpiece W to be performed by ozone and active oxygen produced by the vacuum ultraviolet light.

In FIG. 8, a reference 50 denotes a light source unit. The light source unit 50 may include a box-shaped casing 51. The casing 51 may include an opening on one side (on lower side). In the opening of the casing 51, a plate-shaped light passing window member 52 may be provided so as to close the opening air-tightly. The light passing window member 52 may constitute the light passing window. In the casing 51, a plurality of bar-shaped ultraviolet light emission lamps 55 may be disposed so as to allow center axes of the lamps to extend in parallel with one another in a same horizontal plane. Also, a reflection mirror 56 may be provided so as to surround these ultraviolet light emission lamps 55.

The term "plate-shaped" in this specification is interchangeable with any other term such as "sheet-shaped" and "foil-shaped".

In FIG. 8, a reference 60 denotes a treatment stage on which the workpiece W is placed. The treatment stage 60 may include a planar workpiece placement surface 61. On the workpiece placement surface 61, a frame-shaped spacing member 65 may be disposed. The spacing member 65 is configured to form space of a predetermined size between a light-exiting surface 52a of the light passing window member 52 in the light source unit 50 and the workpiece placement surface 61 of the treatment stage 60. On an upper surface of the spacing member 65, a sealing member 66 may be disposed. Thus, the light source unit 50 may be air-tightly disposed on the treatment stage 60 with the sealing member 66 in between, forming a treatment chamber S2 between the light source unit 50 and the treatment stage 60.

Moreover, the treatment stage 60 may be provided with a treatment gas supply through-hole 62 and a treatment gas discharge through-hole 63. The treatment gas supply through-hole 62 is configured to supply an inside of the treatment chamber S2 with a treatment gas having a predetermined oxygen concentration. The treatment gas supply through-hole 62 and the treatment gas discharge through-hole 63 may be formed at spaced positions from each other in an in-plane direction (in a direction of arrangement of the lamps). Thus, the workpiece W may be disposed on the workpiece placement surface 61 at a position between the treatment gas supply through-hole 62 and the treatment gas discharge through-hole 63.

In the light irradiating apparatus having such a configuration, in view of enhancement in treatment efficiency (productivity), it is often considered that a distance from the light-exiting surface 52a of the light passing window member 52 to a treated surface Wa of the workpiece W may be specified to, for example, 1.0 mm or less, preferably 0.1 mm to 0.5 mm both inclusive. Thus, the inventor(s) attempted surface treatment of a multi-layer printed circuit board having a thickness of, for example, 0.1 mm to 0.3 mm both inclusive. A size of a gap between the light-exiting surface 52a of the light passing window member 52 and the treated surface Wa of the workpiece W was specified to, for example, 0.2 mm. It was found that the treated surface of the workpiece was not uniformly treated in some cases. Possible reasons may be as follows. A multi-layer printed circuit board having a small thickness may become warped or wavy in profile over its entirety during bonding of insulating resins in a stacking process or heat treatment, causing deformation of, for example, about 2 mm at maximum. This may make it difficult to uniformize, entirely over the treated surface Wa, the distance from the light-exiting surface 52a of the light passing window member 52 to the treated surface Wa of the workpiece W. Accordingly, even when an oxygen concentration of the inside of the treatment chamber S2 is in a uniform state, there may be variation in intensity of the vacuum ultraviolet light coming from the ultraviolet light emission lamp 55, which seems to make it difficult to perform uniform treatment of the workpiece W. Also, the workpiece W may have an individual difference in a degree of deformation, which may also actually make it difficult to perform uniform treatment of the workpiece W.

EMBODIMENTS

Figure 1:
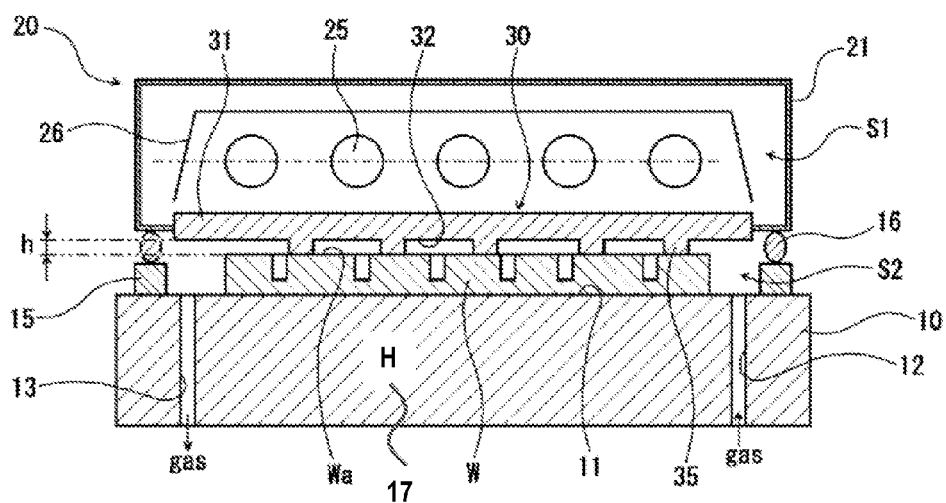
FIG. 1 is a schematic explanatory cross-sectional view of a configuration of one example of a light irradiating apparatus according to an example embodiment of the invention.

FIG. 1 is an explanatory cross-sectional view schematically illustrating a configuration of one example of a light irradiating apparatus according to an example embodiment of the invention. The light irradiating apparatus includes a treatment stage 10 and a light source unit 20. The treatment stage 10 may include a planar workpiece placement surface 11 on which a workpiece (a work) W is placed. The workpiece W may be substantially plate-shaped and may have flexibility, for example. The light source unit 20 may be disposed on the treatment stage 10 with a frame-shaped spacing member 15 in between. In one embodiment of the invention, the treatment stage 10 may serve as a "holder".

The light source unit 20 may include a casing 21. The casing 21 may include an opening on one side (on lower side in FIG. 1), and may be shaped as a substantially rectangular parallelepiped box. In the opening of the casing 21, a light passing window member 30 may be provided air-tightly, allowing a sealed lamp housing chamber 51 to be formed in an inside of the casing 21. The light passing window member 30 is configured to transmit vacuum ultraviolet light. In one embodiment of the invention, the light passing window member 30 may serve as a "light passing window". In the inside of the casing 21, ultraviolet light emission lamps 25 may be disposed side by side so as to allow their center axes to extend in parallel with one another in a same horizontal plane. The ultraviolet light emission lamps 25 each may be bar-shaped. Moreover, a reflection mirror 26 may be provided at a position on a back-surface side of the ultraviolet light emission lamps 25 in a direction of light irradiation of the light source unit 20. Also, in the casing 21, an inert gas purge section (not illustrated) may be provided. The inert gas purge section is configured to purge an inert gas such as, but not limited to, a nitrogen gas.

In the light source unit 20, the casing 21 may be disposed so as to allow a lower surface of the casing 21 to face and be in contact with an upper surface of the rectangular frame-shaped spacing member 15 with a sealing member 16 in between. The spacing member 15 may be disposed on the workpiece placement surface 11 of the treatment stage 10. Thus, a treatment chamber S2 may be formed between the light source unit 20 and the treatment stage 10.

As the ultraviolet light emission lamps 25, various kinds of known lamps may be adopted as long as they are configured to emit vacuum ultraviolet light. Specific but non-limiting examples of the ultraviolet light emission lamps 25 may include low-pressure mercury lamps configured to emit vacuum ultraviolet light of 185 nm, xenon excimer lamps configured to emit vacuum ultraviolet light with a center wavelength of 172 nm, and fluorescence-emitting excimer lamps in which a xenon gas is sealed in a light emission tube and an inner surface of the light emission tube is coated with, for example, a phosphor configured to emit vacuum ultraviolet light of 190 nm.

In the light irradiating apparatus illustrated in FIG. 1, for example, vacuum ultraviolet light from the ultraviolet light emission lamps 25 are collectively applied to the workpiece W to perform treatment. In such a configuration, in order to obtain uniformity in intensity of ultraviolet light at a surface (hereinafter, also referred to as a "treated surface") Wa of the workpiece W, the ultraviolet light emission lamps 25 of circular cylindrical shapes may be preferably used.

The light irradiating apparatus may include a treatment gas supplier. The treatment gas supplier is configured to supply an inside of the treatment chamber S2 with a treatment gas containing oxygen of a predetermined concentration. Specific description of the treatment gas supplier may be as follows. The treatment stage 10 may be provided with a treatment gas supply through-hole 12 and a gas discharge through-hole 13. The treatment gas supply through-hole 12 and the gas discharge through-hole 13 each may extend in a thickwise direction of the treatment stage 10 and each may penetrate the treatment stage 10. An undepicted treatment gas supply source may be coupled to the treatment gas supply through-hole 12. The treatment gas supply through-hole 12 and the gas discharge through-hole 13 both may be configured of an elongated hole whose opening may be shaped as, for example, an ellipse elongated along a direction of lamp axes of the ultraviolet light emission lamps 25. Moreover, the treatment gas supply through-hole 12 and the gas discharge through-hole 13 may be formed, for example, at spaced positions from each other in a direction of arrangement of the ultraviolet light emission lamps 25. Here, the workpiece W may be disposed, on the workpiece placement surface 11 of the treatment stage 10, at a position between the treatment gas supply through-hole 12 and the gas discharge through-hole 13 in the direction of the arrangement of the ultraviolet light emission lamps 25.

The oxygen concentration of the treatment gas to be supplied to the inside of the treatment chamber S2 may be, for example, preferably 50% or more, and more preferably 80% or more. This makes it possible to increase amounts of ozone and active oxygen produced by the vacuum ultraviolet light, and to perform expected treatment.

Now, in the light irradiating apparatus, the light passing window member 30 includes a spacer. The spacer is adapted to be disposed between the light passing window member 30 and the workpiece W, to apply a pressing force onto the workpiece W and to form a gap that allows a distance h to be of a uniform size over the entire surface Wa of the workpiece W. The distance h is a distance from a light-exiting surface of the light passing window member 30 to the surface Wa of the workpiece W.

Specifically, the light passing window member 30 may include a base 31. The base 31 may be plate-shaped, and may have a thickness of a uniform size. The spacer may include a plurality of protrusions 35. The plurality of protrusions 35 may be integrally formed on a light-exiting surface (hereinafter referred to as a "light-exiting surface") 32 of the base 31 of the light passing window member 30. Moreover, the protrusions 35 may be configured to allow a tip of each of the protrusions 35 to be in contact with the treated surface Wa of the workpiece W to apply the pressing force onto the workpiece W. Thus, in one embodiment of the invention, the protrusions 35 may serve as a "spacer", allowing the distance h from the light-exiting surface 32 of the base 31 to the treated surface Wa of the workpiece W to be of a uniform size. Here, the distance h from the light-exiting surface 32 of the base 31 to the treated surface Wa of the workpiece W may be, for example, preferably 1 mm or less, and more preferably 0.5 mm or less. This makes it possible to produce ozone and active oxygen stably and to allow the vacuum ultraviolet light reaching the treated surface Wa of the workpiece W to have sufficient intensity (an amount of light).

The protrusions 35 may be shaped as, for example, cylindrical pillars, and may be equal in height to one another. The protrusions 35 may be provided in a discrete dot pattern on the light-exiting surface 32 of the base 31. Preferably, the protrusions 35 may be adapted to allow a sum of area of the tips of the protrusions 35 to be 20% or less of area of the light-exiting surface 32 of the base 31. Also, area of the tip of each of the protrusions 35 may be preferably 20% or less of the sum of the area of the tips of the protrusions 35. With such configurations, it is possible to restrain the protrusions 35 from shielding the vacuum ultraviolet light or blocking the flow of the treatment gas to a smaller degree.

There may be no particular limitation on a pattern of forming the protrusions 35. For example, the plurality of protrusions 35 may be disposed in a lattice pattern at a predetermined pitch (a center distance). In an alternative in which, for example, the workpiece W includes a non-treatment region that does not have to be subjected to treatment in a region to be irradiated with light from the light source unit 20, the protrusions 35 may be in an unevenly distributed state to allow many of the protrusions 35 to be located in a region corresponding to the non-treatment region. Also, the plurality of protrusions 35 may be preferably disposed so as to form a gap among the protrusions 35, allowing the treatment gas to flow over the treated surface Wa of the workpiece W. The gap among the protrusions 35 may establish communication from the treatment gas supply through-hole 12 to the gas discharge though-hole 13.

A height of the protrusions 35 may be, for example, preferably 1 mm or less, and more preferably 0.5 mm or less, as mentioned above, in relation to the size of the distance h from the light-exiting surface 32 of the base 31 to the treated surface Wa of the workpiece W.

In the forgoing, as a material that constitutes the base 31 of the light passing window member 30, as mentioned above, materials that have transmittance with respect to the vacuum ultraviolet light emitted from the ultraviolet light emission lamps 25, and have resistance to the vacuum ultraviolet light and ozone may be used. For example, silica glass may be used. In an alternative, the protrusions 35 may be configured of a separate material from that of the base 31. In such a case, as a material that constitutes the protrusions 35, various materials may be used as long as they have resistance to the vacuum ultraviolet light and ozone. In order to restrain the protrusions 35 from shielding the vacuum ultraviolet light, materials that have transmittance with respect to the vacuum ultraviolet light, e.g., silica glass may be preferably used.

The light passing window member 30 may be manufactured by, for example, photolithography. Specifically, a plate-shaped light passing window material may be etched, with one surface masked, with use of, for example, a hydrogen fluoride aqueous solution to form the protrusions 35. Thus, the light passing window member 30 illustrated in FIG. 1 may be obtained. Alternatively, one surface of a plate-shaped light passing window material may be carved by sandblast treatment or grinding work, with places of the protrusions masked, to form the protrusions 35. In this way, the light passing window member 30 illustrated in FIG. 1 may be manufactured. Furthermore, for example, glass beads or other meltable members may be disposed on one surface of a plate-shaped light passing window material. The plate-shaped light passing window material may be configured of, for example, silica glass. Heating with use of, for example, an electric furnace may allow the glass beads to be welded to form the protrusions 35. Thus, the light passing window member 30 illustrated in FIG. 1 may be manufactured.

In the light irradiating apparatus according to the example embodiment of the invention, a pressure adjustment mechanism may be preferably provided. The pressure adjustment mechanism is configured to keep, in operation, a pressure of an atmosphere including the ultraviolet light emission lamp 25 higher than a pressure of an atmosphere including the workpiece W. The atmosphere including the ultraviolet light emission lamp 25 and the atmosphere including the workpiece W is separated by the light passing window member 30.

The pressure adjustment mechanism may have a function of adjusting an amount of supply of the inert gas by the inert gas purge section and an amount of supply of the treatment gas by the treatment gas supplier, so as to keep a pressure of an inside of the lamp housing chamber 51 higher than a pressure of the inside of the treatment chamber S2. Keeping the atmosphere of the inside of the lamp housing chamber S1 higher than the pressure of the inside of the treatment chamber S2 makes it possible to allow the protrusions 35 to be in contact with the treated surface Wa of the workpiece W to apply the pressing force owing to a pressure difference onto the workpiece W. In contrast, in a case that the treatment gas is supplied to allow the pressure of the inside of the treatment chamber S2 to be higher than the pressure of the inside of the lamp housing chamber S1, a pressure difference may cause a force to act in a direction in which the light passing window member 30 is spaced apart from the workpiece W. This may make it difficult to allow the protrusions 35 to be in contact with the treated surface Wa of the workpiece W to apply the pressing force onto the workpiece W.

The pressure (a gage pressure) of the inside of the treatment chamber S2 obtained by the supply of the treatment gas may be, for example, preferably 300 Pa or more. Moreover, the pressure (a gage pressure) of the inside of the lamp housing chamber S1 obtained by the supply of the inert gas may be, for example, preferably 400 Pa or more. Also, the pressure difference between the inside of the lamp housing chamber S1 and the inside of the treatment chamber S2 may be, for example, preferably 100 Pa or more. Moreover, in the light irradiating apparatus according to the example embodiment of the invention, the treatment stage 10 may be preferably provided with a heater 17. The heater 17 is configured to heat the workpiece W. This configuration allows for an increase in a temperature of the treated surface Wa of the workpiece W, accompanied by promotion of action of ozone and active oxygen, leading to effective treatment. It is also possible to supply the treatment gas in a heated condition to the inside of the treatment chamber S2. This also allows the flow of the treatment gas over the treated surface Wa of the workpiece W to cause the increase in the temperature of the treated surface Wa of the workpiece W, making it possible to obtain the example effects described above.

Heating conditions by the heater 17 may be conditions on which the temperature of the treated surface Wa of the workpiece W is, for example, preferably 80° C. to 340° C. both inclusive, and more preferably 80° C. to 200° C. both inclusive.

In the light irradiating apparatus, the workpiece W may be placed, on the workpiece placement surface 11 of the treatment stage 10, at a position between the treatment gas supply through-hole 12 and the gas discharge through-hole 13. In this state, the light source unit 20 may be disposed on the treatment stage 10 with the spacing member 15 and the sealing member 16 in between. Thus, the protrusions 35 each may be in contact with the treated surface Wa of the workpiece W to apply the pressing force onto the workpiece W, allowing the distance h from the treated surface Wa of the workpiece W to the light-exiting surface 32 of the base 31 of the light passing window member 30 to be of a uniform size. In this state, by the pressure adjustment mechanism, the inert gas whose amount of supply is appropriately controlled may be purged in the inside of the lamp housing chamber S1, while the treatment gas whose amount of supply is appropriately controlled may be supplied to the inside of the treatment chamber S2. The treatment gas may be heated by the heater 17 in a process of flowing through the treatment gas supply through-hole 12 of the treatment stage 10. Thus, the pressure of the inside of the lamp housing chamber S1 is kept higher than the pressure of the inside of the treatment chamber S2. Here, the pressing force applied by the protrusions 35 onto the workpiece W may be, for example, about 1000 N/m². The treatment gas supplied to the inside of the treatment chamber S2 may flow, along the light-exiting surface 32 and the treated surface Wa, through the gap formed by the protrusions 35 between the light-exiting surface 32 of the base 31 of the light passing window member 30 and the treated surface Wa of the workpiece W.

Then, the ultraviolet light emission lamps 25 may be lighted, allowing the workpiece W to be irradiated with the vacuum ultraviolet light emitted from the ultraviolet light emission lamps 25 and passing through the light passing window member 30. Thus, treatment on the treated surface Wa of the workpiece W may be performed by the vacuum ultraviolet light reaching the treated surface Wa of the workpiece W, and ozone and oxygen produced by the vacuum ultraviolet light.

Here, in the above-described light irradiating apparatus, the protrusions 35 allow their tips to be in contact with the treated surface Wa of the workpiece W to apply the pressing force onto the workpiece W. This allows for correction of deformation such as, but not limited to, a curvature of the workpiece W itself, making it possible to perform treatment in a state in which the distance h from the light-exiting surface 32 of the base 31 of the light passing window member 30 to the treated surface Wa of the workpiece W is of a uniform size over the entire treated surface Wa of the workpiece W. Hence, it is possible to allow intensity of the vacuum ultraviolet light applied to the treated surface Wa of the workpiece W to be substantially uniform, and to allow a concentration of ozone produced by the vacuum ultraviolet light to be substantially uniform, which results in uniform treatment on the workpiece W.

Moreover, the treatment gas is allowed to flow through the gap formed by the protrusions 35 between the light-exiting surface 32 of the base 31 of the light passing window member 30 and the treated surface Wa of the workpiece W. This allows the oxygen concentration over the treated surface Wa of the workpiece W to be substantially uniform. Hence, it is possible to produce ozone and active oxygen stably and to perform treatment of the workpiece W stably.

Furthermore, by the pressure adjustment mechanism, the pressure of the inside of the lamp housing chamber S1 may be kept higher than the pressure of the inside of the treatment chamber S2. This allows the pressing force generated by the pressure difference to be applied onto the workpiece W, in addition to the pressing force owing to a self-weight of the light passing window member 30, allowing for the correction of the deformation of the workpiece W. Hence, it is possible to obtain the example effects described above.

Figure 2:
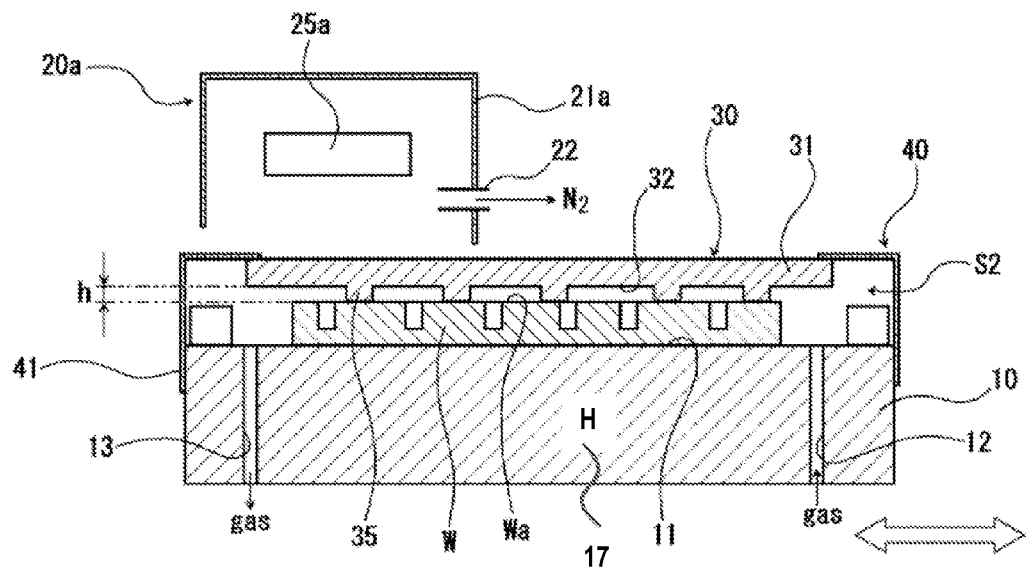
FIG. 2 is a schematic explanatory cross-sectional view of a configuration of another example of a light irradiating apparatus according to an example embodiment of the invention.

Although description of the invention has been made by giving the example embodiments as mentioned above, the contents of the invention are not limited to the above-mentioned example embodiments and may be modified in a variety of ways. For example, the light irradiating apparatus illustrated in FIG. 1 has a configuration of a so-called batch irradiation type. However, as illustrated in FIG. 2, the light irradiating apparatus may have a configuration of a scan type.

The light irradiating apparatus may include a holder 40, a light source unit 20a, and a drive section (not illustrated). The holder 40 is configured to hold the workpiece W. The light source unit 20a may include an ultraviolet light emission lamp 25a. The drive section is configured to allow one of the light source unit 20a and the holder 40 to move in a horizontal direction relatively to another. In this example, for example, the holder 40 is allowed by the drive section to move in the horizontal direction relatively to the light source unit 20a. In the figure, a void arrow denotes a direction of movement of the holder 40.

The holder 40 may include a light passing window holder frame 41. The light passing window holder frame 41 may be mounted on the treatment stage 10 including the planar workpiece placement surface 11, and may be attachable to and detachable from the treatment stage 10. The light passing window holder frame 41 may define the treatment chamber S2 provided with the opening opened on upper side. Further, the light passing window member 30 may be provided so as to air-tightly close the opening of the light passing window holder frame 41. In one embodiment of the invention, the light passing window member 30 may serve as a "light passing window". The treatment stage 10 may be provided with the treatment gas supply through-hole 12 and the gas discharge through-hole 13. The treatment gas supply through-hole 12 is configured to supply the treatment gas of a predetermined oxygen concentration to the inside of the treatment chamber S2. The treatment gas supply through-hole 12 and the gas discharge through-hole 13 may be provided at spaced positions from one another in the direction of the movement (conveyance) of the holder 40. Here, the workpiece W may be disposed at a position between the treatment gas supply through-hole 12 and the gas discharge through-hole 13.

The light passing window member 30 may have a same configuration as that in the light irradiating apparatus illustrated in FIG. 1, for example. Detailed description thereof is omitted.

The light source unit 20a may include a casing 21a and the ultraviolet light emission lamp 25a. The casing 21a may be opened on one side (on lower side in the example illustrated in the figure). The ultraviolet light emission lamp 25a may be disposed, in the casing 21a, in a posture with a lamp center axis extending horizontally. The casing 21a may be provided with a gas passage pipe 22 to allow the inert gas (e.g., a nitrogen gas $N_2$) to flow in the casing 21a.

In the light irradiating apparatus of such a scan type, in order to obtain a high output, as the ultraviolet light emission lamp 25a, for example, a rectangular shaped excimer lamp configured to emit light in a specific direction may be preferably used.

In the light irradiating apparatus, adjusting a speed of the movement of the holder 40 makes it possible to optimize an amount of exposure of the workpiece W to be irradiated with the vacuum ultraviolet light. In the light irradiating apparatus of such a scan type, a configuration provided with a plurality of holders (treatment stages) may be possible. In such a configuration, before performing treatment to allow one workpiece held by one of the plurality of holders to be irradiated with the vacuum ultraviolet light from the light source unit, it is possible to perform, in advance, in a separate process, attachment of another workpiece or supply of the treatment gas to another of the plurality of holders. This allows for continuous irradiation treatment with ultraviolet light, leading to enhancement in productivity. Moreover, in the light irradiating apparatus according to the example embodiment of the invention, a configuration of the light passing window is not limited to those illustrated in FIGS. 1 and 2.

Figure 3A:
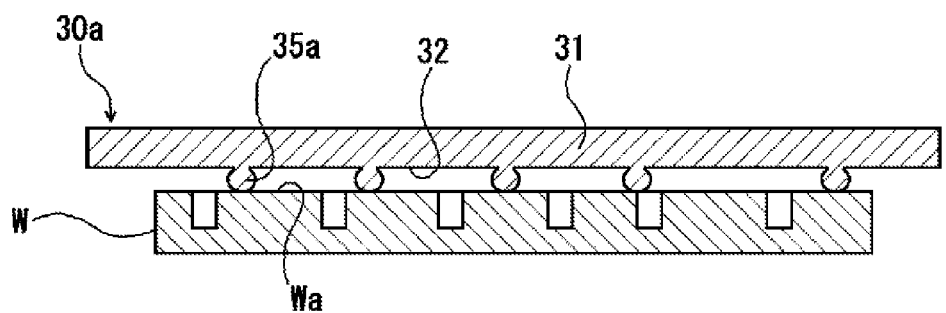
FIG. 3A schematically illustrates a configuration of another example of a light passing window.
Figure 3B:
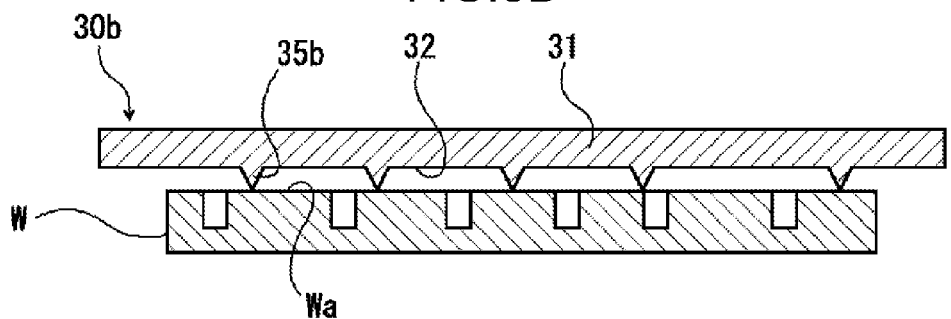
FIG. 3B schematically illustrates a configuration of another example of a light passing window.

For example, each of the protrusions may be shaped to allow cross-sectional area along a cutting plane orthogonal to a heightwise direction of the protrusions to decrease as approaching a tip of each of the protrusions. Specifically, as in a configuration illustrated in FIG. 3A, protrusions 35a may be provided on the light-exiting surface 32 of the base 31 of a light passing window member 30a. Each of the protrusions 35a may have one of a spherical shape and a semispherical shape. Alternatively, as in a configuration illustrated in FIG. 3B, protrusions 35b may be provided on the light-exiting surface 32 of the base 31 of a light passing window member 30b. Each of the protrusions 35b may be of a conical (e.g., circular conical) shape. In the protrusions 35a and 35b having such configurations, the tips of the protrusions 35a and 35b may be substantially in point contact with the treated surface Wa of the workpiece W. This makes it possible to decrease contact area of the protrusions 35a and 35b and the workpiece W, leading to an increase in a region of the treated surface Wa available for treatment by the vacuum ultraviolet light, ozone, etc. (effective treatment area).

Figure 4:
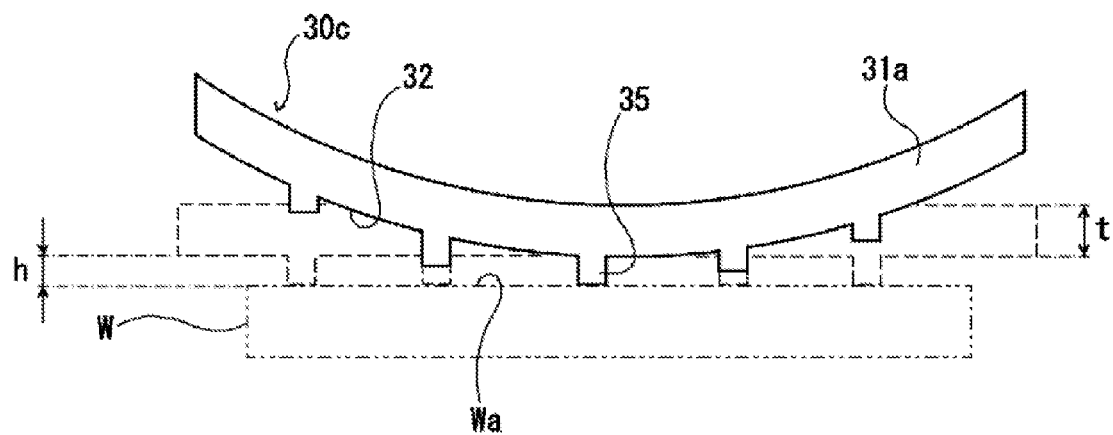
FIG. 4 is a schematic explanatory cross-sectional view of a configuration of still another example of a light passing window.

Furthermore, it is not necessary for the entire light passing window to be configured of the plate-shaped light passing window member. For example, as illustrated in FIG. 4, the entire light passing window may be curved in an arc. A light passing window member 30c may include a base 31a. The base 31a may be curved in an arc and may have a thickness t of a uniform size. The plurality of protrusions 35 may be provided on a convex-side surface (the light-exiting surface) 32 of the base 31a. The protrusions 35 may be in contact with the treated surface Wa of the workpiece W to apply the pressing force onto the workpiece W. The light passing window member 30c may form a plate shape, as denoted by a dot line in FIG. 4, in a state in contact with the workpiece W.

The light passing window member 30c may be obtained as follows. A light passing window material may be prepared by forming protrusions on a surface of a plate-shaped base. The light passing window material may be placed on, for example, a carbon die protruded upward, and may be subjected to heat treatment on predetermined heating conditions.

In the light passing window member 30c having such a configuration, the convexly-curved shape toward the workpiece W makes it possible to apply the great pressing force onto the workpiece W. Specifically, for example, when a plate-shaped light passing window member is pressed onto the workpiece W, they come into an adhered state to each other. However, the supply of the treatment gas to between the workpiece W and the light passing window member may cause a pressure of the treatment gas to be applied to the light passing window member. In a case that the pressure of the treatment gas is equal to or larger than the pressure of the lamp-side atmosphere of the light passing window member (the pressure of the inside of the lamp housing chamber), a center portion of the light passing window member, whose periphery is usually fixed, may be convexly protruded toward the lamp side. This may result in a lowered effect of pressing the workpiece with the light passing window member, or difficulty in obtaining such an effect. Here, the light passing window member 30c has the convexly-curved shape toward the workpiece W side, allowing the light passing window member 30c itself to have the pressing force enough to resist the gas pressure that acts owing to the supply of the treatment gas. This makes it possible for the light passing window member 30c to press the workpiece W. Hence, in the light passing window member 30c having such a configuration, it is possible to obtain the example effects described above.

Furthermore, it is not necessary for the spacer interposed between the light passing window and the workpiece to be integrally formed with the light passing window. Instead, the spacer may be configured of, for example, a separate member from the light passing window, as mentioned above.

Figure 5A:
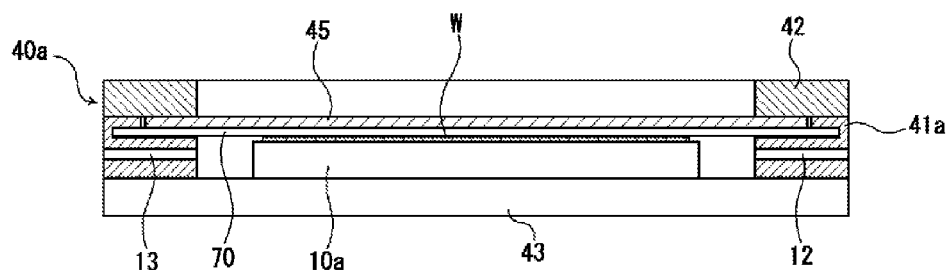
FIG. 5A schematically illustrates a configuration of a holder in still another example of a light irradiating apparatus according to an example embodiment of the invention, and is a vertical cross-sectional view taken along a plane in a direction of flow of a treatment gas.
Figure 5B:
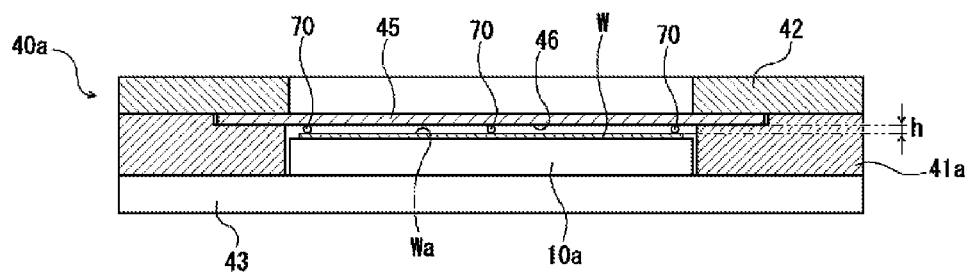
FIG. 5B schematically illustrates the configuration of the holder in the example of FIG. 5A, and is a vertical cross-sectional view taken along a plane orthogonal to the direction of the flow of the treatment gas.

FIGS. 5A and 5B are cross-sectional views illustrating a configuration of a holder in still another example of a light irradiating apparatus according to an example embodiment of the invention. FIG. 5A is a vertical cross-sectional view taken along a plane in a direction of flow of the treatment gas. FIG. 5B is a vertical cross-sectional view taken along a plane orthogonal to the direction of the flow of the treatment gas.

In a holder 40a in the light irradiating apparatus, the workpiece W may be disposed on a treatment stage 10a. On the surface (the treated surface) Wa of the workpiece W, a plurality of wire members 70 may be disposed without overlapping one another. A plate-shaped light passing window member 45 may be disposed so as to allow the wire members 70 to apply the pressing force onto the workpiece W. Thus, by each of the wire members 70, the distance h from a light-exiting surface 46 of the light passing window member 45 to the treated surface Wa of the workpiece W is allowed to be of a uniform size. In one embodiment, the wire members 70 may serve as a "spacer", and the light passing window member 45 may serve as a "light passing window". Each of the wire members 70 may be held with its both ends interposed between the light passing window member 45 and a light passing window holding frame 41a. In this example, each of the wire members 70 may be disposed, at spaced positions from one another, so as to extend in parallel along the direction of the flow of the treatment gas (a right-and-left direction in FIG. 5A). In FIGS. 5A and 5B, a reference 42 denotes a window fixing member, and a reference 43 denotes a base.

Each of the wire members 70 may be made of, for example, a metal wire. A wire diameter of the wire member 70 may be, for example, preferably $\phi1$ mm or less, and more preferably $\phi5$ mm or less, in relation to the size of the distance h from the light-exiting surface 46 of the light passing window member 45 to the treated surface Wa of the workpiece W, as mentioned above.

Figure 6A:
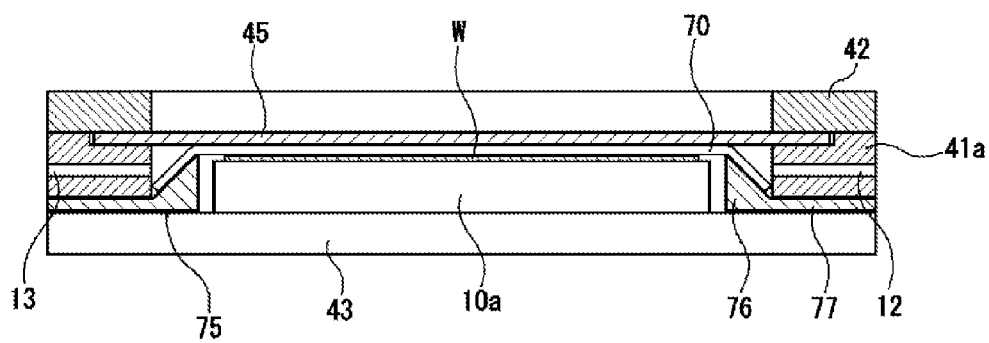
FIG. 6A schematically illustrates a configuration of a holder in still another example of a light irradiating apparatus according to an example embodiment of the invention, and is a vertical cross-sectional view taken along the plane in the direction of the flow of the treatment gas.
Figure 6B:
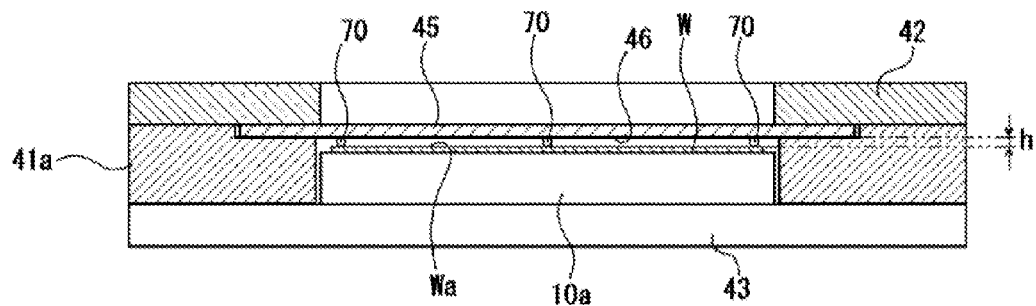
FIG. 6B schematically illustrates the configuration of the holder in the example of FIG. 6A, and is a vertical cross-sectional view taken along the plane orthogonal to the direction of the flow of the treatment gas.

In the forgoing, in a case that the spacer includes the wire members, there is no particular limitation on a method of holding the wire members. For example, as illustrated in FIGS. 6A and 6B, a structure may be formed in which the plurality of wire members 70 are held by a common wire member holding member 75, and the structure may be held. The wire member holding member 75 in this example may include a frame 76 and a flange 77. The frame 76 may be provided with an opening that extends in an upper-and-lower direction, and may have a pair of side walls facing each other. The plurality of wire members 70 may be stretched at an open edge of one of the pair of side walls. The flange 77 may be provided so as to protrude outward from an open edge of another of the pair of side walls. Also, the flange 77 of the wire member holding member 75 may be interposed and fixed between the base 43 and the light passing window holding frame 41a. This may allow the plate-shaped light passing window member 45, which may serve as a "light passing window" in one embodiment of the invention, to be disposed so as to allow the wire members 70 to apply the pressing force onto the workpiece W. Also, it is not necessary for the wire members 70 to be stretchable so as to extend linearly. The wire members 70 may be, for example, curved in a same plane, so as not to block the flow of the treatment gas. Moreover, there is no particular limitation on the number of the wire members 70.

Figure 7A:
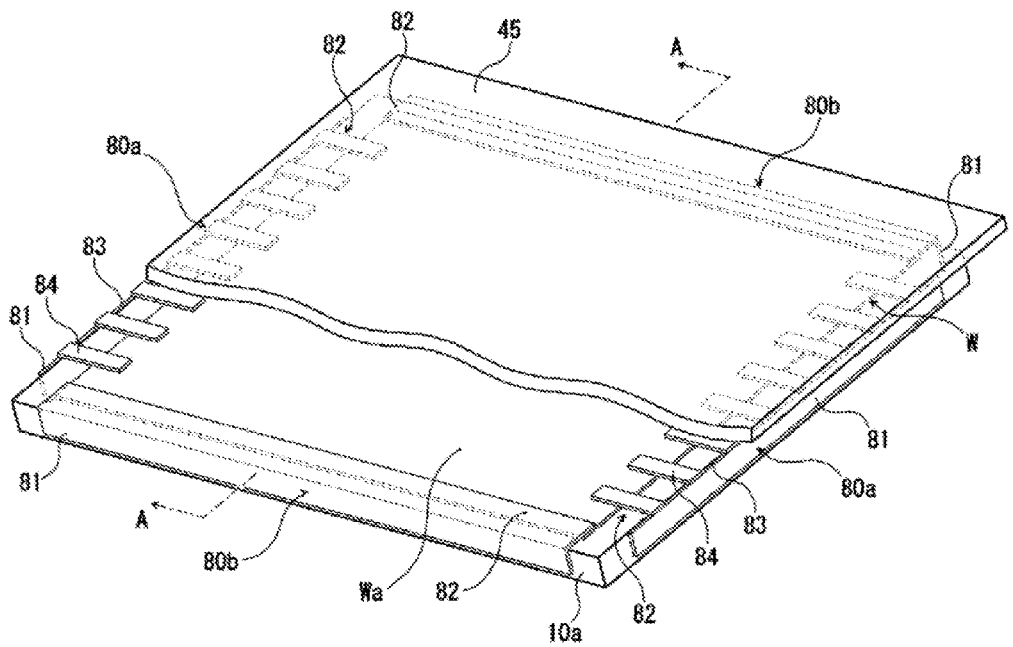
FIG. 7A is a schematic partly-omitted perspective view of a configuration of a holder in still another example of a light irradiating apparatus according to an example embodiment of the invention.
Figure 7B:
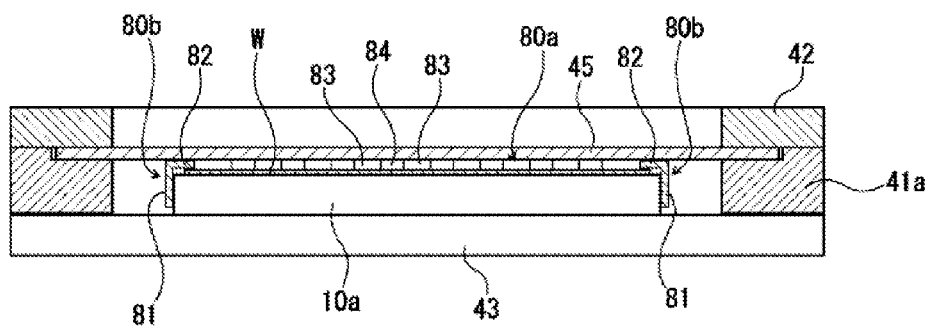
FIG. 7B is a cross-sectional view taken along a line 7B-7B in FIG. 7A.

Furthermore, as illustrated in FIG. 7, the spacer may include plate pieces. In this example, workpiece retainers 80a and 80b may be disposed on four sides of the treatment stage 10a. Each of the workpiece retainers 80a and 80b may be L-shaped in cross-section, and may include a vertical plate piece 81 and a horizontal plate piece 82. The vertical plate piece 81 may be positioned to face and to be in contact with a peripheral side surface of the treatment stage 10a. The horizontal plate piece 82 may be engaged with a peripheral edge part of the surface (the treated surface) Wa of the workpiece W.

A thickness of the horizontal plate piece 82 of each of the workpiece retainers 80a and 80b may be, for example, preferably $\phi1$ mm or less, and more preferably $\phi0.5$ mm or less, in relation to the size of the distance h from the light-exiting surface 46 of the light passing window member 45 to the treated surface Wa of the workpiece W, as described above.

In addition, a pair of the workpiece retainers 80a may be disposed in the direction of the flow of the treatment gas so as to face each other. In the pair of the workpiece retainers 80a, the horizontal plate piece 82 may be provided with a plurality of notches 83 for the flow of the treatment gas, allowing tongue-shaped holder parts 84 to be formed in a pattern of comb teeth. Each of the workpiece retainers 80a and 80b may be supported as follows; the plate-shaped light passing window member 45 may be disposed so as to allow the workpiece retainers 80a and 80b to apply the pressing force onto the workpiece W, allowing the horizontal plate piece 82 to be interposed between the light passing window member 45 and the treatment stage 10a. Thus, the horizontal plate piece 82 in the workpiece retainers 80a and 80b may serve as a "spacer", forming a gap in which the distance h from the light-exiting surface 46 of the light passing window member 45 to the treated surface Wa of the workpiece W is of a uniform size.

As described above, even in a case that the spacer may include wire members or plate pieces, it is possible to correct the deformation such as, but not limited to, a curvature, etc. of the workpiece W itself, making it possible to obtain the example effects described above.

Furthermore, in the light irradiating apparatus according to the example embodiment of the invention, replacement of the workpieces may involve allowing the light passing window to be spaced apart from the workpiece. Thus, for example, the light irradiating apparatus illustrated in FIG. 1 may further include a drive section. The drive section is configured to drive one of the light source unit 20 and the treatment stage 10 in a vertical direction relatively to the other. In such a configuration, the replacement of the workpieces W is easily carried out, while the drive section allows the protrusions 35 to be in contact with the treated surface Wa of the workpiece W to apply the pressing force onto the workpiece W. This makes it possible to allow the distance h (a thickness of the gap) from the light-exiting surface 32 of the base 31 of the light passing window member 30 to the treated surface Wa of the workpiece W to be of a uniform size.

In the following, description is given on Experimental Examples performed to confirm effects of the example embodiment of the invention.

Experimental Example 1

The light irradiating apparatus according to the example embodiment of the invention was manufactured referring to the configuration illustrated in FIG. 1. Specifications of the light irradiating apparatus were as follows.
  Treatment Stage (10)
  Dimensions: 650 mm×650 mm, with a thickness of 20 mm
  Material: aluminum
  Heater (17)
  A resistance heating heater configured to operate on heating conditions on which the temperature of the treated surface of the workpiece is 150° C.
  Light Source Unit (20)
  The ultraviolet light emission lamp (25): a xenon excimer lamp having an arc length of 700 mm and an outer diameter of φ40 mm
  The number of the ultraviolet light emission lamps: five
  Input power: 500 W
  Light Passing Window Member (30)]
  Dimensions of the base: 550 mm×550 mm, with a thickness of 7 mm ¥Material of the base: silica glass
  Dimensions of the protrusions: φ0.3 mm, height 0.2 mm (cylindrical pillar shaped)
  Pattern in which the protrusions are formed: in a square lattice, pitch 50 mm
  Material of the protrusions: silica glass
  Distance from the light-exiting surface of the base of the light passing window member to the workpiece placement surface of the treatment stage: 0.1 mm (calculated distance from the light-exiting surface of the base of the light passing window member to the treated surface of the workpiece: 0.2 mm)
  Pressing force applied onto the workpiece from the light passing window member: about 1000 N/m$^2$
  Treatment Gas Supplier]
  Treatment gas: oxygen concentration 100%
  Amount of supply of the treatment gas: 10 liter/min
  Pressure (gage pressure) of the inside of the treatment chamber: 300 Pa
  Inert Gas Supplier
  Inert gas: nitrogen gas
  Amount of supply of the inert gas: about 100 liter/min
  Pressure (gage pressure) of the inside of the lamp housing chamber: 400 Pa
  Moreover, as the workpiece, a printed circuit board material (with a thickness of 0.2 mm) was used. The printed circuit board material was configured of a 0.1 mm thick copper foil and a 0.1 mm thick insulating layer formed on the copper foil, and was provided with a plurality of via-holes. Dimensions of the printed circuit board material were 500 mm×500 mm. A hole diameter of the via-hole was φ0.05 mm.

With use of the above-described light irradiating apparatus, vacuum ultraviolet light was applied for 30 minutes to perform desmear treatment on the printed circuit board material. It was confirmed that smear adhered to upper portions, side walls, or bottom portions of the via-holes were all removed.

Comparative Experiment Example

A light irradiating apparatus for comparison was manufactured referring to the configuration illustrated in FIG. 8. The light irradiating apparatus for comparison had a same configuration as that of the light irradiating apparatus manufactured in Experimental Example 1 except for using a plate-shaped light passing window member including no protrusions.

In the light irradiating apparatus for comparison, the distance from the light-exiting surface of the light passing window member to the workpiece placement surface of the treatment stage was specified to 2.2 mm (a calculated distance from the light-exiting surface of the light passing window member to a treated surface of the printed circuit board material was 0.2 mm) With use of the light irradiating apparatus for comparison, in a similar method to that of Experimental Example 1, desmear treatment was performed on the printed circuit board material. It was confirmed that smear remained in the bottom portions of some of the via-holes. One possible reason may be as follows. In reality, the printed circuit board material had waviness, etc., causing difficulties in allowing the distance (the gap) from the light-exiting surface of the light passing window member to the treated surface of the printed circuit board material to be uniform. It was therefore difficult to perform uniform treatment. Actually, the smear remained in the via-holes located in concave parts of the waviness of the printed circuit board material. It is therefore plausible that a gap size in the relevant region was larger than that in other regions, which hindered sufficient action of the vacuum ultraviolet light and ozone (or active oxygen).

It is possible to achieve at least the following configurations from the above-described example embodiments of the invention.

(1) A light irradiating apparatus, including:
  an ultraviolet light emission lamp configured to emit vacuum ultraviolet light toward a workpiece to be disposed in an atmosphere of a treatment gas including oxygen;
  a light passing window adapted to be disposed between the workpiece and the ultraviolet light emission lamp and configured to allow the vacuum ultraviolet light from the ultraviolet light emission lamp to pass therethrough, the light passing window having a light-exiting surface; and
  a spacer adapted to be disposed between the light passing window and the workpiece, to apply a pressing force onto the workpiece and to form a gap that allows a distance from the light-exiting surface of the light passing window to a surface of the workpiece to be of a uniform size over the entire surface of the workpiece.

(2) The light irradiating apparatus according to (1) may further include a pressure adjustment mechanism configured to keep, in operation, a pressure of an atmosphere including the ultraviolet light emission lamp higher than a pressure of an atmosphere including the workpiece, the atmosphere including the ultraviolet light emission lamp and the atmosphere including the workpiece being separated by the light passing window.

According to the configuration (2) of the light irradiating apparatus, the pressure of the atmosphere may including the ultraviolet light emission lamp may be kept higher than the pressure of the atmosphere including the workpiece. This allows the workpiece to be pressed by the pressing force acting by a pressure difference, in addition to a self-weight of the light passing window, allowing for correction of deformation of the workpiece. Hence, it is possible to obtain the example effects described above.

(3) The light irradiating apparatus according to (1) or (2), wherein the light passing window may include a base having a thickness of a uniform size and having a light-exiting surface, and the spacer may include a plurality of protrusions provided on the light-exiting surface of the base, the plurality of protrusions being configured to be in contact with the surface of the workpiece to apply the pressing force onto the workpiece.

(4) The light irradiating apparatus according to (1) above, wherein the spacer may be made of glass.

(5) The light irradiating apparatus according to (1) above, wherein the spacer may include a metal wire.

(6) The light irradiating apparatus according to (3) above, wherein the base of the light passing window may be adapted to have a convexly-curved shape toward the workpiece. According to the configuration (6) of the light irradiating apparatus, the light passing window may be adapted to have a convexly-curved shape toward the workpiece. This allows the light passing window to be in contact with the workpiece to have a shape of a plate, making it possible to apply the great pressing force to the workpiece. Hence, it is possible to obtain the example effects described above.

(7) The light irradiating apparatus according to any one of (1) to (6) above may include a treatment gas supplier configured to supply the treatment gas to the gap formed by the spacer between the light-exiting surface of the light passing window and the surface of the workpiece.

According to the configuration (7) of the light irradiating apparatus, the treatment gas may be allowed to flow through the gap formed by the spacer between the light-exiting surface of the light passing window and the surface of the workpiece. This allows an oxygen concentration over the surface of the workpiece to be substantially uniform. Hence, it is possible to produce ozone and active oxygen stably and to perform treatment of the workpiece stably.

(8) The light irradiating apparatus according to (3), wherein the plurality of protrusions may be made of a light transmitting material that transmits the vacuum ultraviolet light.

(9) The light irradiating apparatus according to (3), wherein each of the plurality of protrusions may be shaped to allow cross-sectional area along a cutting plane orthogonal to a heightwise direction of the plurality of protrusions to decrease as approaching a tip of each of the plurality of protrusions.

(10) The light irradiating apparatus according to (3), wherein each of the plurality of protrusions may have one of a spherical shape and a semispherical shape.

(11) The light irradiating apparatus according to (1) or (2), wherein the spacer may include wire members to be stretchable over the surface of the workpiece without overlapping one another.

(12) The spacer may include plate pieces to be provided in a peripheral edge part of the surface of the workpiece.

(13) The light irradiating apparatus according to (1) or (2) above may further include a holder configured to hold the workpiece, wherein the holder includes a heater configured to heat the workpiece.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A light irradiating apparatus, comprising:
   an ultraviolet light emission lamp configured to emit vacuum ultraviolet light toward a workpiece to be disposed in an atmosphere of a treatment gas including oxygen;
   a light passing window adapted to be disposed between the workpiece and the ultraviolet light emission lamp and configured to allow the vacuum ultraviolet light from the ultraviolet light emission lamp to pass therethrough, the light passing window comprising a light-exiting surface; and
   a spacer adapted to be disposed between the light passing window and the workpiece, to apply a pressing force onto the workpiece and to form a gap that allows a distance from the light-exiting surface of the light passing window to a surface of the workpiece to be of a uniform size over the entire surface of the workpiece,
   wherein the light passing window includes a base having a thickness of a uniform size and having a light-exiting surface, and
   the spacer comprises a plurality of protrusions provided on the light-exiting surface of the base, the plurality of protrusions being configured to be in contact with the surface of the workpiece to apply the pressing force onto the workpiece.

2. The light irradiating apparatus according to claim 1, further comprising a pressure adjustment mechanism configured to keep, in operation, a pressure of an atmosphere including the ultraviolet light emission lamp higher than a pressure of an atmosphere including the workpiece, the atmosphere including the ultraviolet light emission lamp and the atmosphere including the workpiece being separated by the light passing window.

3. The light irradiating apparatus according to claim 1, wherein the spacer is made of glass.

4. The light irradiating apparatus according to claim 1, wherein the spacer comprises a metal wire.

5. The light irradiating apparatus according to claim 1, wherein the base of the light passing window is adapted to include a convexly-curved shape toward the workpiece.

6. The light irradiating apparatus according to claim 1, further comprising
   a treatment gas supplier configured to supply the treatment gas to the gap formed by the spacer between the light-exiting surface of the light passing window and the surface of the workpiece.

7. The light irradiating apparatus according to claim 1, wherein each of the plurality of protrusions is made of a light transmitting material configured to transmit the vacuum ultraviolet light.

8. The light irradiating apparatus according to claim 1, wherein each of the plurality of protrusions is shaped to allow cross-sectional area along a cutting plane orthogonal to a heightwise direction of the plurality of protrusions to decrease as approaching a tip of each of the plurality of protrusions.

9. The light irradiating apparatus according to claim 1, wherein each of the plurality of protrusions has one of a spherical shape and a semispherical shape.

10. The light irradiating apparatus according to claim 1, wherein the spacer comprises wire members to be stretchable over the surface of the workpiece without overlapping one another.

11. The light irradiating apparatus according to claim 1, wherein the spacer comprises plate pieces to be provided in a peripheral edge part of the surface of the workpiece.

12. The light irradiating apparatus according to claim 1, further comprising
a holder configured to hold the workpiece, wherein the holder includes a heater configured to heat the workpiece.

13. A light irradiating apparatus, comprising:
an ultraviolet light emission lamp configured to emit vacuum ultraviolet light toward a workpiece to be disposed in an atmosphere of a treatment gas including oxygen;
a light passing window adapted to be disposed between the workpiece and the ultraviolet light emission lamp and configured to allow the vacuum ultraviolet light from the ultraviolet light emission lamp to pass therethrough, the light passing window comprising a light-exiting surface; and
a spacer adapted to be disposed between the light passing window and the workpiece, to apply a pressing force onto the workpiece and to form a gap that allows a distance from the light-exiting surface of the light passing window to a surface of the workpiece to be of a uniform size over the entire surface of the workpiece,
wherein the spacer comprises wire members to be stretchable over the surface of the workpiece without overlapping one another.

* * * * *